(12) United States Patent
Feight et al.

(10) Patent No.: US 8,510,066 B2
(45) Date of Patent: Aug. 13, 2013

(54) SELF-CALIBRATING VOLTAGE SENSOR

(75) Inventors: Laurence V. Feight, Island Lake, IL (US); Ryan W. Swartzendruber, Prospective Heights, IL (US); Kurt J. Fenske, Gleason, WI (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 576 days.

(21) Appl. No.: 12/139,985

(22) Filed: Jun. 16, 2008

(65) Prior Publication Data

US 2008/0312856 A1    Dec. 18, 2008

Related U.S. Application Data

(60) Provisional application No. 60/934,717, filed on Jun. 15, 2007.

(51) Int. Cl.
| | |
|---|---|
| *G01R 19/00* | (2006.01) |
| *G01R 31/00* | (2006.01) |
| *G01R 3/00* | (2006.01) |
| *H03F 1/26* | (2006.01) |
| *H04B 15/00* | (2006.01) |

(52) U.S. Cl.
USPC ............... 702/64; 702/58; 702/146; 702/199

(58) Field of Classification Search
USPC .................. 702/57, 58, 64, 116, 146, 199
See application file for complete search history.

(56) References Cited

U.S. PATENT DOCUMENTS

| | | |
|---|---|---|
| 3,676,740 A | 7/1972 | Schweitzer |
| 3,702,966 A | 11/1972 | Schweitzer |
| 3,708,724 A | 1/1973 | Schweitzer |
| 3,715,742 A | 2/1973 | Schweitzer |
| 3,725,832 A | 4/1973 | Schweitzer |
| 3,781,682 A | 12/1973 | Schweitzer |
| 3,816,816 A | 6/1974 | Schweitzer |
| 3,866,197 A | 2/1975 | Schweitzer |
| 3,876,911 A | 4/1975 | Schweitzer |
| 3,906,477 A | 9/1975 | Schweitzer |
| 4,063,171 A | 12/1977 | Schweitzer |
| 4,152,643 A | 5/1979 | Schweitzer |
| 4,234,847 A | 11/1980 | Schweitzer |
| 4,375,617 A | 3/1983 | Schweitzer |
| 4,438,403 A | 3/1984 | Schweitzer |
| 4,456,873 A | 6/1984 | Schweitzer |
| 4,458,198 A | 7/1984 | Schweitzer |
| 4,495,489 A | 1/1985 | Schweitzer |
| 4,794,329 A | 12/1988 | Schweitzer |
| 4,794,331 A | 12/1988 | Schweitzer |
| 4,794,332 A | 12/1988 | Schweitzer |

(Continued)

OTHER PUBLICATIONS

S.T.A.R.™ Faulted Circuit Indicators PATHFINDER™ Variable Trip Test Point Type; Cooper Power Systems; Electrical Apparatus 320-42 ISO 9001:2000—Certified Quality Management System; cooperpower.com 1999.

*Primary Examiner* — Alexander H Taningco
*Assistant Examiner* — Manuel Rivera Vargas
(74) *Attorney, Agent, or Firm* — Eugene M. Cummings, PC

(57) ABSTRACT

A voltage sensor consists of a number of capacitive voltage sensors coupled to test points in an electrical power system. The outputs of the voltage sensors are digitized and processed by a digital processor, which determines a normal value for the monitored AC voltages, and then determines if the monitored AC voltages are acceptable based on variations from the normal value.

17 Claims, 3 Drawing Sheets

(56) References Cited

U.S. PATENT DOCUMENTS

| | | | |
|---|---|---|---|
| 4,795,982 | A | 1/1989 | Schweitzer |
| 4,873,706 | A | 10/1989 | Schweitzer |
| 4,904,932 | A | 2/1990 | Schweitzer |
| 4,984,124 | A | 1/1991 | Yeh |
| 5,008,651 | A | 4/1991 | Schweitzer |
| 5,045,778 | A | 9/1991 | Thibodeau |
| 5,070,301 | A | 12/1991 | Schweitzer |
| 5,077,520 | A | 12/1991 | Schweitzer |
| 5,095,265 | A | 3/1992 | Schweitzer |
| 5,153,565 | A | 10/1992 | Schweitzer |
| 5,168,414 | A | 12/1992 | Horstmann |
| 5,180,972 | A | 1/1993 | Schweitzer |
| 5,216,621 | A * | 6/1993 | Dickens ............... 702/58 |
| 5,274,324 | A | 12/1993 | Schweitzer |
| 5,363,088 | A | 11/1994 | Schweitzer |
| 5,406,195 | A | 4/1995 | Schweitzer |
| 5,420,502 | A | 5/1995 | Schweitzer |
| 5,498,956 | A * | 3/1996 | Kinney et al. ............ 324/142 |
| 5,677,623 | A | 10/1997 | Schweitzer |
| 5,677,678 | A | 10/1997 | Schweitzer |
| 5,729,125 | A | 3/1998 | Schweitzer |
| 5,754,383 | A | 5/1998 | Huppertz |
| 5,821,869 | A | 10/1998 | Schweitzer |
| 5,889,399 | A | 3/1999 | Schweitzer |
| 5,959,537 | A | 9/1999 | Banting |
| 5,990,674 | A | 11/1999 | Schweitzer |
| 6,014,301 | A | 1/2000 | Schweitzer |
| 6,016,105 | A | 1/2000 | Schweitzer |
| 6,043,433 | A | 3/2000 | Schweitzer |
| 6,133,723 | A | 10/2000 | Feight |
| 6,133,724 | A | 10/2000 | Schweitzer |
| 6,211,764 | B1 | 4/2001 | Schweitzer |
| 6,429,661 | B1 | 8/2002 | Schweitzer |
| 6,433,698 | B1 | 8/2002 | Schweitzer |
| 6,479,981 | B2 | 11/2002 | Schweitzer |
| 6,734,662 | B1 | 5/2004 | Fenske |
| 6,798,211 | B1 | 9/2004 | Rockwell |
| 6,822,576 | B1 | 11/2004 | Feight |
| 6,894,478 | B1 | 5/2005 | Fenske |
| 6,949,921 | B1 | 9/2005 | Feight |
| 6,963,197 | B1 | 11/2005 | Feight |
| 7,023,691 | B1 | 4/2006 | Feight |
| 7,053,601 | B1 | 5/2006 | Fenske |
| 7,106,048 | B1 | 9/2006 | Feight |

\* cited by examiner

US 8,510,066 B2

SELF-CALIBRATING VOLTAGE SENSOR

CROSS REFERENCE TO RELATED APPLICATIONS

This document claims priority under 35 U.S.C. §119(e) to U.S. Provisional Application 60/934,717, titled "Self-Calibrating Voltage Sensor", filed on Jun. 15, 2007, and naming Larry Virgil Feight, Kurt Fenske, and Ryan Swartzendruber as inventors, and is hereby incorporated by a reference in its entirety.

FIELD OF THE INVENTION

The present invention relates generally to systems, methods and apparatus for sensing voltages in an electrical power system, and more particularly to systems, methods and apparatus for sensing a voltage change in an electrical power system, wherein the scope of such change is on the order of installation-to-installation variations in coupling capacitance.

DESCRIPTION OF THE PRIOR ART

Voltage sensors are used by the electric utility industry for a variety of purposes. Generally, a voltage sensor will activate a contact when the voltage in a monitored line goes outside of an acceptable range. While some voltage sensors use potential transformers to interface with high-voltage systems, it is generally more practical for voltage sensors to interface with high-voltage lines by capacitive coupling. Voltage sensors are usually coupled to high-impedance lines in one of two ways: (1) through a capacitive test point (TP) present in many power system termination elbows, and (2) by coupling to a voltage sensing bushing (VSB) that is itself capacitively coupled to the powerline.

To insure an accurate measurement of voltage, and thereby provide accurate operation of a voltage sensor, the voltage sensor must account for the power line coupling capacitance. The usual method of accounting for the coupling capacitance is to insure that the range of acceptable voltages is broad enough to account for variance in coupling capacitance from installation to installation. This effectively precludes establishing a narrow acceptable operating range for a voltage sensor.

OBJECTS OF THE INVENTION

Accordingly, an object of the invention is to provide a capacitively coupled voltage sensor that can operate with a narrow acceptable operating range.

Another object of the invention is to provide a voltage sensor that can adjust to changes in the average voltage level of a monitored AC line over time, and still reliably detect a dropout.

A further object of the invention is to provide a voltage sensor that can adjust to changes in the coupling capacitance to a monitored AC line over time.

SUMMARY OF THE INVENTION

The disclosed invention achieves its objectives through an innovative sensing algorithm that determines a normal level for a monitored AC voltage and then determines if the monitored voltage has gone outside of acceptable limits for the monitored waveform. In one embodiment, a system for monitoring an AC voltage includes a voltage detecting circuit capacitively coupled to a power system such as a three-phase power system. The outputs of the voltage detecting circuits are digitized and processed by a processor, which generates a voltage-out-of-range signal when the monitored AC voltage drops below a predetermined percentage of the normal value for a predetermined time period.

In another embodiment, the disclosed invention is implemented as a method, wherein a normal voltage for a monitored AC voltage is calculated. Based on the calculated normal value, an acceptable range is determined. A voltage-out-of-range signal is then generated if the monitored AC voltage falls outside of the acceptable range.

BRIEF DESCRIPTION OF THE DRAWINGS

Although the characteristic features of this invention will be particularly pointed out in the claims, the invention itself, and the manner in which it may be made and used, may be better understood by referring to the following description taken in connection with the accompanying drawings forming a part hereof, wherein like reference numerals refer to like parts throughout the several views and in which:

DETAILED DESCRIPTION OF THE ILLUSTRATED EMBODIMENT

Figure 1:
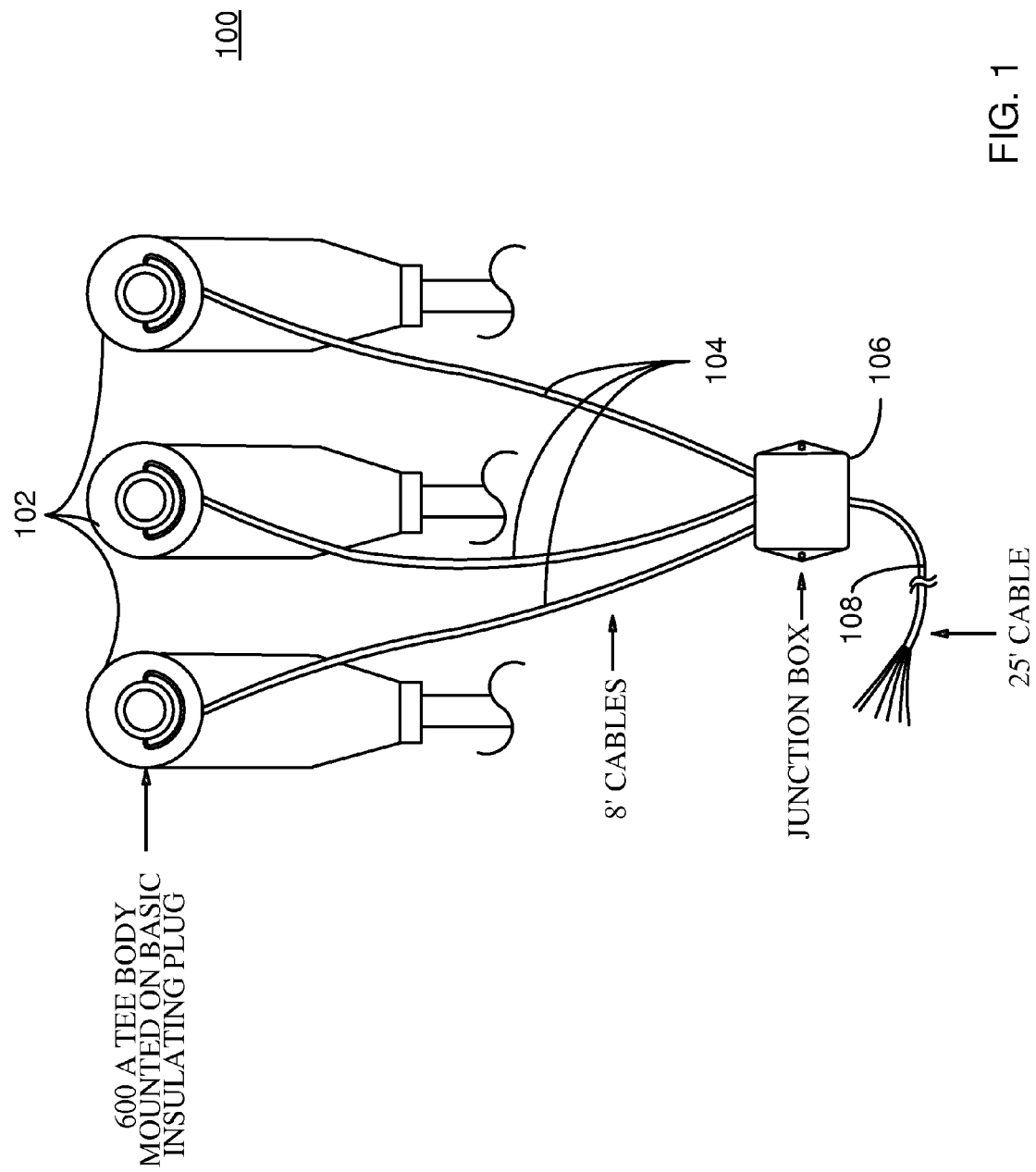
FIG. 1 illustrates a simple Wye configuration three-phase voltage sensor adapted for mounting on a basic insulation plug.

Referring to the figures, and to FIG. 1 in particular, a typical voltage sensor 100 constructed in accordance with the disclosed invention is depicted. This particular voltage sensor 100 is configured to measure a three phase Wye-configured power system, and includes three basic insulating plug (BIP) sensors 102, although test-point voltage sensors, configured to capacitively couple with standard elbow test points, could also be used. The three BIP sensors 102 are coupled to a junction box 106 via cables 104. In addition, power leads 108 accept DC power to power the junction box circuitry, which is explained in more detail in FIG. 2. While 24V power is typical in the American electrical utility industry, any DC power voltage could conceivably be used. Further, the power circuitry inside the voltage sensor 100 could be adapted to accept a range of voltages, such as 18V to 36V.

Figure 2:
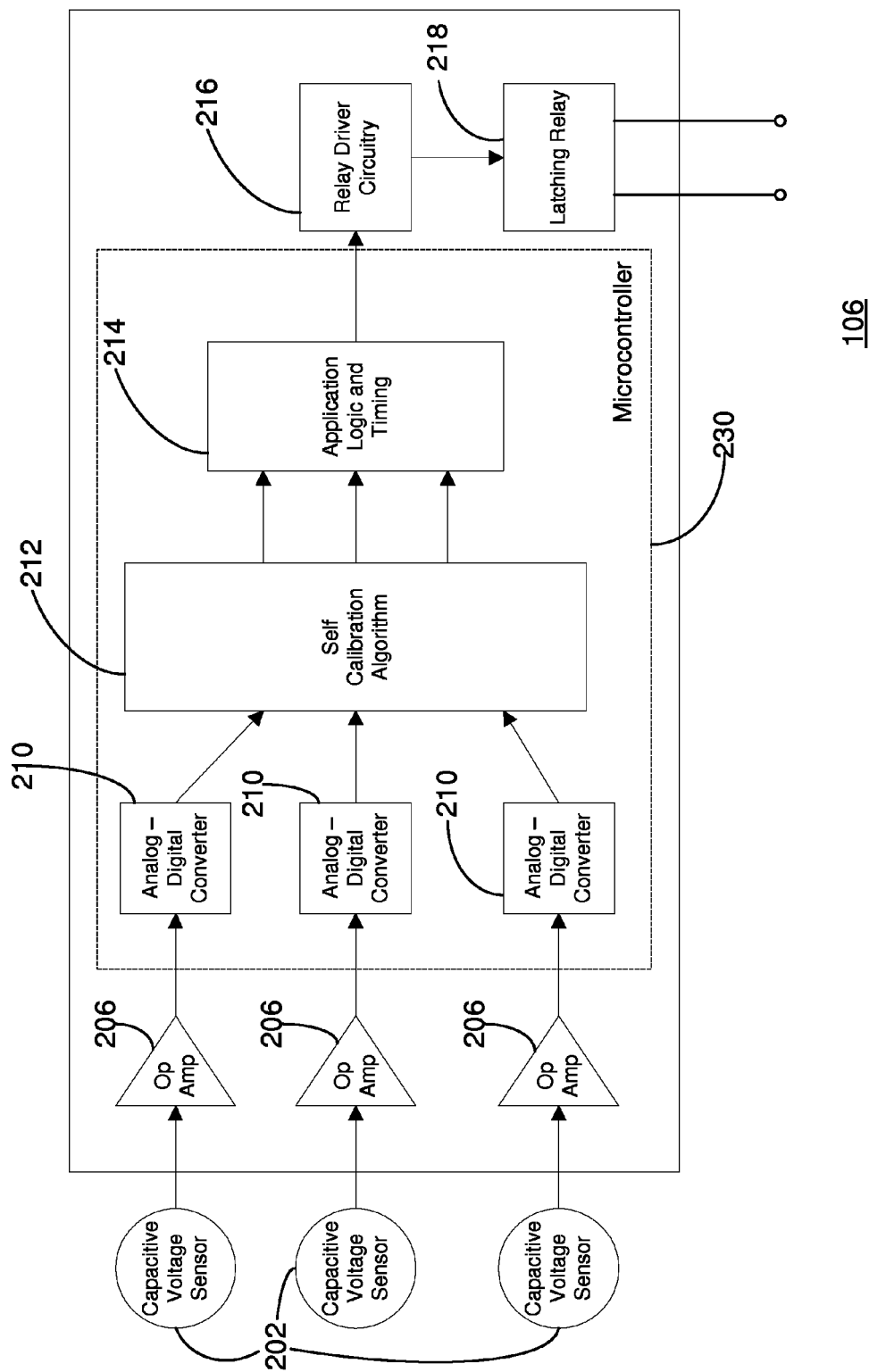
FIG. 2 is a block diagram of a voltage sensing system constructed in accordance with an embodiment of the disclosed invention.

Turning now to FIG. 2, a block diagram of the junction box 106 is illustrated. Capacitive voltage sensors 202 monitor voltages in a three phase power system (not pictured), and are designed to capacitively couple to a power line through, for instance, a standard elbow test point. The outputs of the capacitive voltage sensors 202 are amplified by operational amplifiers 206 and digitized by analog to digital converters 210. As depicted, the microcontroller 230 includes the analog to digital converters (ADCs) 206. However, discrete ADCs could be used along with a discrete processor in place of the integrated microcontroller 230.

The microcontroller 230 is programmed with software routines 212 and 214, which determine if voltage monitored by any of the capacitive voltage sensors 202 has fallen outside of an acceptable range by, for example, exceeding an acceptable range. For example, the microcontroller 230 may be programmed to determine if the voltage drops below 75% of a normal value on any phase. The functioning of the microcontroller software is described in more detail in FIG. 3 and the accompanying text. The microcontroller is coupled to relay driver circuitry 216 which may be actuated to indicate when one of the monitored voltages has exceeded the acceptable range. The relay driver circuitry 216 is coupled to a latching relay 218, which may be connected to an alarm circuit (not shown) or some other indicating device.

The disclosed invention uses a self-calibrating routine to account for installation to installation variations in coupling capacitance. To account for installation variances, a baseline voltage level is established and updated over time for each monitored phase. Changes from this baseline are monitored, and if the present voltage varies from the baseline by a predetermined percentage, an out-of-range signal can be generated.

One way to calculate a baseline value for a quantity is to establish the mean level of the quantity over a time period. For example, the baseline of a voltage may be established by calculating the mean of the peak voltages over 5 seconds. The usual way to calculate a mean for a time-varying quantity (q) is to calculate a simple moving average (SMA), using the following formula:

$$SMA = \frac{\sum_{1}^{N} q_n}{N} \text{ or } SMA = \frac{q_{n-1} + q_{n-2} + \ldots + q_{n-N}}{N}$$

As illustrated, for each new sample that is taken, the oldest sample is discarded, and the calculation is repeated. Therefore, N samples must be stored in memory. Depending on the time period over which the SMA is calculated, the number of samples stored can be very large, and the memory requirements can be prohibitive for small scale embedded microcontrollers, such as those used in typical voltage sensors.

To implement the disclosed system in a memory constrained environment, a different technique for calculating a moving average was devised. While the calculated quantity is not mathematically identical to a simple moving average, it has been found to perform adequately for the purpose of calculating a normal value for a monitored AC voltage, while requiring far less storage. This method of calculating an average is referred to as a Pseudo Running Average (PRA).

The first step in calculating a PRA is to initialize a default sum $S_{def}$ to an average value, $P_{def}$, multiplied by a sample count, N, which is determined by the time period for which the PRA is to be calculated (note that ordinary digital signal processing techniques, such as digital sampling, are well known in the art, and will not be discussed here). In one embodiment, the sample count is a limit to the number of samples that each sum can contain, $N_{sum}$. The previous operation can be expressed as an equation as follows:

$$S_{def} = P_{def} N_{sum}$$

Once the default sum $S_{def}$ has been initialized, the average $P_n$ is recalculated as each sample is taken. The last average calculated, $P_{n-1}$, is subtracted from the sampled value (monitored value $X_n$), and the last calculated sum $S_{n-1}$ sample is added in The result is a new calculated sum $S_n$, which is divided by N to recalculate the average. The following equations describes this process:

$$S_n = S_{n-1} + (X_n - P_{n-1})$$

$$P_n = \frac{S_n}{N}$$

Where n represents the present sampling period, n−1 represents the previous sampling period, $S_n$ represents the calculated sum, $X_n$ represents the monitored value, $P_n$ represents the calculated average, and N represents the number of samples used to calculate the average.

One problem with the PRA is transitioning the calculated average between the default value and a value reflecting the actual measured quantity. Until the calculated average reaches a value approximating the normal of the measured quantity, it is useless in making decisions based on instantaneous values of the measured quantity. While the length of the transition period can be calculated with reasonable certainty, it is still desirable to minimize this period as much as possible. The disclosed invention accomplishes this through the use of a weighted ramp-in period as described below.

When first activated, the disclosed voltage sensor (or another device using the PRA algorithm) weights incoming samples using the following formula:

$$W_h = \begin{cases} W_0 - R \cdot h : R \cdot h < W_0 - 1 \\ 1 : R \cdot h \geq W_0 \end{cases}$$

$$h = \text{INT}\left(\frac{t}{T_R}\right)$$

Where $T_R$ is the weight reduction time period, $W_0$ is the initial sample weight, and R is the weight reduction rate, $W_h$ is the calculated sample weight for a particular sample, t is the time at which the calculation is performed, and h is an integer approximation of the time divided by the weight reduction time period. For example, where R=1, $T_R$=1, and $W_0$=10, then the calculated sample weight $W_h$ for each integer approximation of the time divided by the weight reduction time period h follows the values:

| h | $W_h$ |
|---|---|
| 0 | 10 |
| 1 | 9 |
| 2 | 8 |
| 3 | 7 |
| 4 | 6 |
| 5 | 5 |
| 6 | 4 |
| 7 | 3 |
| 8 | 2 |
| 9 | 1 |
| =10 | 1 |

Once the appropriate weight is calculated, a difference between a monitored value $X_n$ and a last average $P_{n-1}$ is multiplied by the weight, and added to the last calculated sum $S_{n-1}$ to produce a new calculated sum $S_n$.

$$S_n = S_{n-1} + W_h(X_n - P_{n-1})$$

Figure 3:
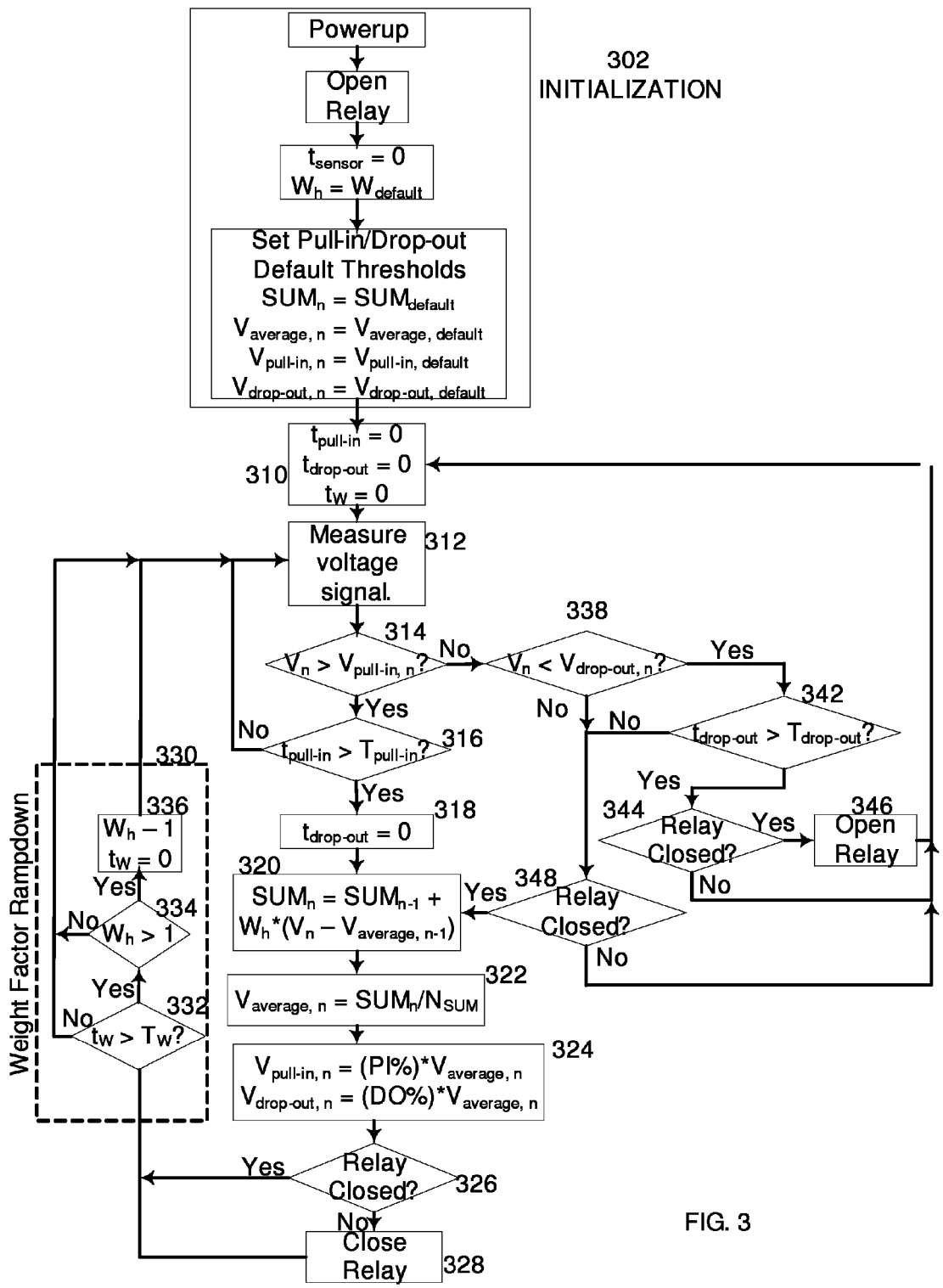
FIG. 3 is a flow chart illustrating one possible implementation of a program constructed in accordance with an embodiment of the disclosed invention for operation on the processor depicted in FIG. 2.

FIG. 3 illustrates the program implemented by the microcontroller 230 of the disclosed system. The program begins with an initialization process 302. As part of the initialization process 302, the microcontroller 230 causes the relay driver circuitry 216 to open the latching relay 218. In addition, a phase sensor timer, $t_{sensor}$, which acts as a master timer for the voltage sensor, is initialized. In addition, the weight ramp-in algorithm is initialized, the PRA algorithm is loaded with default values, and a pull-in voltage and drop-out voltage are calculated based on those defaults. Note that the pull-in voltage and drop-out voltage will usually vary; for instance, the drop-out voltage may be set to 75% of the average voltage, while the pull-in voltage may be set to 90% of the average voltage.

The program then transitions to a further initialization step 310, where three timers are initialized. The pull-in timer, $t_{pull-in}$, measures the time that a particular average phase voltage has measured within the acceptable range (as defined below). The drop-out timer, $t_{drop-out}$, measures the time period that a particular average phase voltage has measured outside of the acceptable range. The weight timer, $t_w$, is used to operate the weight ramp-in algorithm.

In step 312 a new digital voltage sample is acquired. This voltage sample is taken at the peak of a power cycle; therefore, approximately 50-60 samples are taken per second, depending on the power system frequency. If the acquired sample is greater than the pull-in level, $V_{pull-in}$, the program transitions to step 316. In step 316, the program determines whether the time the monitored voltage has exceeded the pull-in level $V_{pull-in}$, as indicated by timer $t_{pull-in}$, exceeds the pull-in period $T_{pull-in}$. If not, the program transitions to step 312, where another voltage sample is acquired at the appropriate time. However, if timer $t_{pull-in}$ exceeds the pull-in period $T_{pull-in}$, the program transitions to step 318, where the drop-out timer, $t_{drop-out}$, is reinitialized, and onto step 320, where sum $SUM_n$ is incremented according to the PRA algorithm. The program then transitions to step 322, where the average voltage is determined, and step 324, where the pull-in voltage, $V_{pull-in}$, and drop-out voltage, $V_{drop-out}$, are recalculated.

In step 326, the program determines if the latching relay 218 is in its normal position. In a normally closed (NC) relay system, if the relay has not already been closed, it will be closed in step 328. In a normally open system, the relay would be opened, as the execution path of the program indicates that the monitored voltage is "normal." Regardless of the state of the relay, the program will then update weight factors in the weight factor rampdown routine 330.

The weight factor rampdown routine 330 implements the earlier discussed weighted ramp-in period. In step 332, the timer, $t_W$, is checked against the ramp-in adjustment period $T_W$. If the timer, $t_W$, does not exceed the ramp-in adjustment period, $T_W$, the program transitions to step 312, where another voltage sample is taken at the appropriate time. However, if the timer $t_W$ does exceed the ramp-in adjustment period, $T_W$, the program transitions to step 334, where the present sample weight, $W_h$, is examined to see if it has already ramped down to the normal value (one). If so, the program transitions to step 312 where another voltage sample is taken at the appropriate time. However, if the present sample weight exceeds the normal value, the program transitions to step 336, where the present sample weight, $W_h$, is decremented, and the timer $t_W$ is reset.

Returning to step 314, if the most recently measured voltage sample is less than the pull-in voltage, $V_{pull-in}$, the program transitions to step 338. In step 338, the program determines if the measured voltage sample is less than the drop-out voltage, $V_{drop-out}$. If not, the program transitions to step 348, which is discussed later. However, if the voltage sample is less than the drop-out voltage, $V_{drop-out}$, the program transitions to step 342, where the drop-out timer, $t_{drop-out}$, is checked against the drop-out period, $T_{drop-out}$. If the drop-out timer, $t_{drop-out}$, exceeds the drop-out period, $T_{drop-out}$, the program transitions to step 344, where the status of the relay is checked, and potentially changed in step 346. Conversely, if the drop-out timer, $t_{drop-out}$, does not exceed the drop-out period, $T_{drop-out}$, the status of the relay is checked in step 348. If the relay is in its normal position, the program transitions to step 320, where the program will resume as normal. Conversely, if the relay is not in its normal position, the program transitions to step 310, where the pull-in, drop-out and weighting timers are re-initialized.

The use of a normal level could be used in other applications where the normal value of a measured quantity varies from installation-to-installation. For example, a faulted circuit indicator (FCI) is a device used to indicate when a fault event (overcurrent) has occurred on a powerline. Usually, after a fault is detected, a protective device will isolate the faulted line, and current in the line will drop to near zero. However, many power system customers will use a backup generator when power from the utility is cut. This will cause a line monitored by a FCI to apparently reenergize, even though the utility has cut power to it. The FCI will then transition from its tripped state to its untripped state, even though the monitored line is still isolated by the utility. By monitoring the normal value of the line voltage, the FCI could detect a variation between the pre-fault line voltage, and the post-fault line voltage, and remain in its tripped position. This would aid utility workers in more quickly identifying faults.

While other advantages will be apparent to persons of ordinary skill in the art, the disclosed voltage sensor can operate with very narrow acceptable ranges as compared to traditional voltage sensors. This is because the use of the normal; i.e., average, voltage level effectively accounts for installation-to-installation differences in coupling capacitance. Further, the disclosed voltage sensor can maintain this narrow acceptable range even if a monitored AC voltage changes over time, as the normal value is constantly recalculated. Moreover, even if the coupling capacitance changes over time, the disclosed voltage sensor will operate properly, because this change will merely affect normal value for the monitored AC voltage.

The present disclosure further contemplates that predetermined values may be obtained by other methods. For example, the predetermined values may be retrieved from a stored look-up table. In another example, the predetermined values may be calculated. Further, certain values may be obtained using one method, wherein other values may be obtained using other methods.

The foregoing description of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and various modifications as are suited to the particular use contemplated. It is intended that the scope of the invention not be limited by the specification, but be defined by the claims set forth below.

We claim:

1. A method for detecting when a monitored AC voltage falls outside of an acceptable range comprising:
   i) calculating an average peak voltage value based on measured peak voltage values of the monitored AC voltage, wherein the average peak voltage value is calculated by accumulating a sum of a predetermined number of measured peak voltage values, subtracting a previously calculated average peak voltage value from the sum, adding a present measured peak voltage value to the sum, and dividing the sum by the predetermined number;

ii) calculating the acceptable range based on the average peak voltage value; and iii) generating a voltage-out-of-range signal if the monitored AC voltage exceeds the acceptable range.

2. The method of claim 1, further comprising generating a drop-out voltage equal to a predetermined percentage of the average peak voltage value, and wherein generating comprises generating the voltage-out-of-range signal if the monitored AC voltage drops below the drop-out-voltage for a predetermined time period.

3. The method of claim 2, further comprising:

i) generating a pull-in voltage equal to a second predetermined percentage of the average peak voltage value; and ii) terminating the voltage-out-of-range signal after the voltage-out-of-range signal was generated, when the monitored AC voltage rises above the pull-in voltage for a second predetermined time period.

4. The method of claim 1, further comprising generating a drop-out voltage equal to a percentage of the average peak voltage value retrieved from a look-up table, and wherein generating comprises generating the voltage-out-of-range signal if the monitored AC voltage drops below the drop-out voltage for a time period retrieved from a look-up table.

5. The method of claim 4, further comprising:

i) generating a pull-in voltage equal to a second percentage of the average peak voltage value retrieved from a look-up table; and ii) terminating the voltage-out-of-range signal after the voltage-out-of-range signal was generated, when the monitored AC voltage rises above the pull-in voltage for a second time period retrieved from a look-up table.

6. The method of claim 1, further comprising generating a drop-out voltage equal to a calculated percentage of the average peak voltage value, and wherein generating comprises generating the voltage-out-of-range signal if the monitored AC voltage drops below the drop-out-voltage for a calculated time period.

7. The method of claim 6, further comprising:

i) generating a pull-in voltage equal to a second calculated percentage of the average peak voltage value; and ii) terminating the voltage-out-of-range signal after the voltage-out-of-range signal was generated, when the monitored AC voltage rises above the pull-in voltage for a second calculated time period.

8. The method of claim 1, wherein the voltage-out-of-range signal is generated if the monitored AC voltage varies from the average peak voltage value by a predetermined percentage.

9. The method of claim 1, further comprising maintaining the voltage-out-of-range signal if the monitored AC voltage drops to near zero and returns to within the acceptable range with a variation between the monitored AC voltage and the average peak voltage value for the monitored AC voltage.

10. The method of claim 1, wherein the voltage-out-of-range signal is generated if the monitored AC voltage varies from the average peak voltage value by a percentage retrieved from a look-up table.

11. The method of claim 1, wherein the voltage-out-of-range signal is generated if the monitored AC voltage varies from the average peak voltage value by a calculated percentage.

12. A system for detecting when a monitored AC voltage falls outside of an acceptable range comprising:

i) at least one voltage acquisition circuit, the voltage acquisition circuit generating a digital signal representative of the monitored AC voltage;

ii) a processor coupled to the voltage acquisition circuit for executing a voltage monitoring algorithm and for generating a voltage out-of-range signal when the monitored AC voltage falls outside of the acceptable range, wherein the processor (a) calculates an average peak voltage value based on measured peak voltage values of the monitored AC voltage wherein the average peak voltage value is calculated by accumulating a sum of a predetermined number of measured peak voltage values, subtracting a previously calculated average peak voltage value from the sum, adding a present measured peak voltage value to the sum, and dividing the sum by the predetermined number;

(b) calculates the acceptable range based on the average peak voltage value, and (c) generates a voltage-out-of-range signal if the monitored AC voltage exceeds the acceptable range.

13. The system of claim 12, wherein the voltage-out-of-range signal is generated if the monitored AC voltage varies from the average peak voltage value by a predetermined percentage.

14. The system of claim 12, further comprising a relay responsive to the voltage-out-range signal, wherein the relay transitions from a normal state to an abnormal state on generation of the voltage-out-of-range signal.

15. The system of claim 12, wherein the processor further (d) generates a drop-out voltage based on a predetermined percentage of the average peak voltage value, and wherein the voltage-out-of-range signal is generated if the monitored AC voltage drops below the drop-out voltage for a first predetermined time period.

16. The system of claim 12, wherein the processor further (e) generates a pull-in voltage based on a second predetermined percentage of the average peak voltage value, and (f) terminates the voltage-out-of-range signal after the voltage-out-of-range signal was generated, when the monitored AC voltage rises above the pull-in voltage for a second predetermined time period.

17. The system of claim 12, wherein the processor further maintains the voltage-out-of-range signal if the monitored AC voltage drops to near zero and returns to the acceptable range with a variation between the monitored AC voltage and the average peak voltage value for the monitored AC voltage.

* * * * *